United States Patent
Gao

(10) Patent No.: US 10,319,794 B2
(45) Date of Patent: Jun. 11, 2019

(54) OLED ARRAY SUBSTRATE, MANUFACTURING METHOD THEREOF, OLED DISPLAY PANEL

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventor: Zhiyang Gao, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/568,990

(22) PCT Filed: Mar. 14, 2017

(86) PCT No.: PCT/CN2017/076584
§ 371 (c)(1),
(2) Date: Oct. 24, 2017

(87) PCT Pub. No.: WO2018/018895
PCT Pub. Date: Feb. 1, 2018

(65) Prior Publication Data
US 2018/0286932 A1 Oct. 4, 2018

(30) Foreign Application Priority Data
Jul. 29, 2016 (CN) .......................... 2016 1 0609987

(51) Int. Cl.
*H01L 51/00* (2006.01)
*H01L 27/32* (2006.01)
(Continued)

(52) U.S. Cl.
CPC .......... *H01L 27/3246* (2013.01); *H01L 27/32* (2013.01); *H01L 27/3211* (2013.01);
(Continued)

(58) Field of Classification Search
CPC ............. H01L 27/3211; H01L 27/3246; H01L 51/5262; H01L 51/5265
(Continued)

(56) References Cited

U.S. PATENT DOCUMENTS 6,339,288 B1   1/2002  Qian et al.
2004/0094768 A1   5/2004  Yu et al.
(Continued)

FOREIGN PATENT DOCUMENTS

CN   101552234 A   10/2009
CN   102017158 A    4/2011
(Continued)

OTHER PUBLICATIONS

International Search Report received for PCT Patent Application No. PCT/CN2017/076584, dated Jun. 12, 2017, 10 pages (4 pages of English Translation and 6 pages of Original Document).
(Continued)

*Primary Examiner* — Long K Tran
(74) *Attorney, Agent, or Firm* — Womble Bond Dickinson (US) LLP

(57) ABSTRACT

The present disclosure provides an OLED array substrate, a manufacturing method thereof, and an OLED display panel. The OLED array substrate comprises a first electrode layer, a pixel definition layer, an organic material functional layer, and a second electrode layer arranged successively in a light exit direction. The organic material functional layer comprises light-emitting regions that emit light of different colors. The pixel definition layer comprises pixel regions corresponding to the light-emitting regions, and spacing
(Continued)

regions arranged between adjacent pixel regions. Each spacing region is configured to electrically isolate adjacent light-emitting regions.

17 Claims, 1 Drawing Sheet

(51) Int. Cl.
*H01L 51/56* (2006.01)
*H01L 51/52* (2006.01)

(52) U.S. Cl.
CPC ...... *H01L 51/5218* (2013.01); *H01L 51/5234* (2013.01); *H01L 51/5265* (2013.01); *H01L 51/56* (2013.01); *H01L 2227/323* (2013.01)

(58) Field of Classification Search
USPC .................................. 357/40; 438/82, 99
See application file for complete search history.

(56) References Cited

U.S. PATENT DOCUMENTS

| | | |
|---|---|---|
| 2008/0230772 A1 | 9/2008 | Kamiura et al. |
| 2011/0101317 A1 | 5/2011 | Gregory et al. |
| 2012/0080694 A1 | 4/2012 | Yoshida et al. |
| 2015/0214505 A1 | 7/2015 | Xiong et al. |
| 2017/0373276 A1 | 12/2017 | Liu et al. |

FOREIGN PATENT DOCUMENTS

| | | |
|---|---|---|
| CN | 103915571 A | 7/2014 |
| CN | 104538559 A | 4/2015 |
| CN | 105742311 A | 7/2016 |
| CN | 106158914 A | 11/2016 |
| JP | 2007-220656 A | 8/2007 |
| JP | 2010-282899 A | 12/2010 |

OTHER PUBLICATIONS

Office Action received for Chinese Patent Application No. 201610609987.6, dated Jul. 31, 2018, 16 pages (9 pages of English Translation and 7 pages of Office Action).

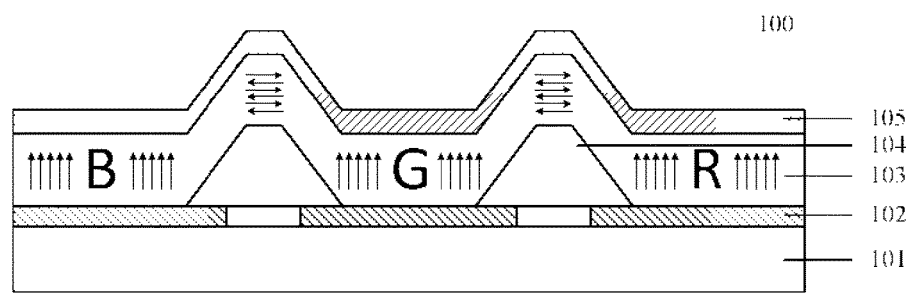
Fig.1 -prior art-
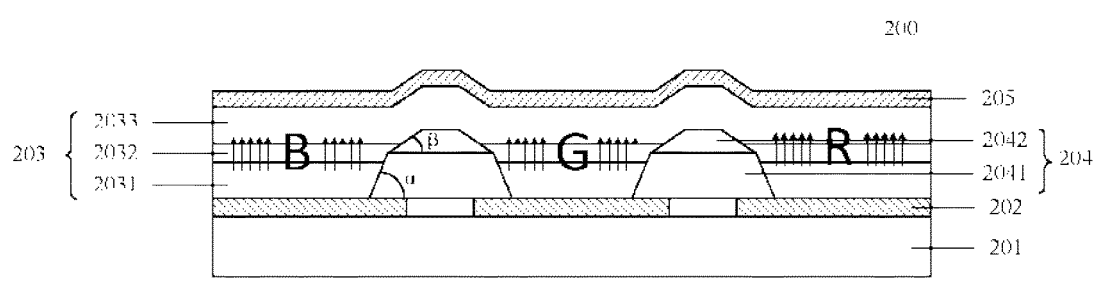
Fig.2
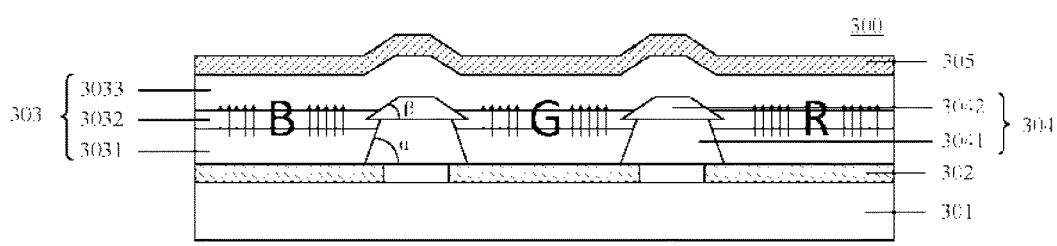
Fig.3

OLED ARRAY SUBSTRATE, MANUFACTURING METHOD THEREOF, OLED DISPLAY PANEL

CROSS-REFERENCE TO RELATED APPLICATIONS

The present application is the U.S. national phase entry of PCT/CN2017/076584, with an international filing date of Mar. 14, 2017, which claims the benefit of Chinese Patent Application No. 201610609987.6, filed on Jul. 29, 2016, the entire disclosure of which is incorporated herein by reference.

FIELD

The present disclosure generally relates to the field of display, and more particularly to an organic light-emitting diode (OLED) array substrate, an OLED display panel comprising such an OLED array substrate, and a manufacturing method of such an OLED array substrate.

BACKGROUND

Organic light-emitting diode (OLED) display technology is a technology that realizes display using reversible color change generated by an organic semiconductor material under the driving of a current. An OLED display has advantages of being ultra-light and ultra-thin, having high brightness, large viewing angle, low voltage, low power consumption, fast response and high resolution, being anti-seismic and bendable, having low cost and simple process, using fewer raw materials, having high luminous efficiency and wide temperature range, and the like, and is hence considered to be the most promising new-generation display technology.

SUMMARY

It is an objective of the present disclosure to provide an improved OLED array substrate, an OLED display panel comprising such an OLED array substrate, and a manufacturing method of such an OLED array substrate.

According to one aspect of the present disclosure, there is provided an OLED array substrate. The OLED array substrate comprises a first electrode layer, a pixel definition layer, an organic material functional layer, and a second electrode layer arranged successively in a light exit direction. The organic material functional layer comprises light-emitting regions that emit light of different colors. The pixel definition layer comprises pixel regions corresponding to the light-emitting regions, and spacing regions arranged between adjacent pixel regions. Each spacing region is configured to electrically isolate adjacent light-emitting regions.

In the OLED array substrate proposed in the present disclosure, by employing the spacing regions that electrically isolate adjacent light-emitting regions, upon displaying a monochromatic image by only illuminating light-emitting regions of a certain color, it is possible to prevent adjacent light-emitting regions of different colors from being also illuminated weakly, which results in abnormal display. As a result, display effect of the display device can be improved.

In some embodiments, the organic material functional layer comprises a first functional layer, a light-emitting layer and a second functional layer arranged successively in the light exit direction, and each spacing region comprises a first spacing portion and a second spacing portion arranged successively in the light exit direction. The first spacing portion is configured to separate portions of at least the first functional layer corresponding to the respective light-emitting regions from each other.

In such an OLED array substrate, the adjacent light-emitting regions are electrically isolated from each other, as long as the portions of the first functional layer corresponding to the respective light-emitting regions are separated from each other. Therefore, as compared to an implementation of separating portions of the first functional layer, the light-emitting layer and the second functional layer corresponding to the respective light-emitting regions from each other, the second functional layer corresponding to the respective light-emitting regions can be integrally formed. Consequently, the manufacturing process of such an OLED array substrate is simpler and the cost thereof is also lower.

In some embodiments, an angle between a side wall of the first spacing portion and a lower surface of the first spacing portion is larger than an angle between a side wall of the second spacing portion and a lower surface of the second spacing portion.

In such an OLED array substrate, by making the angle between the side wall of the first spacing portion and the lower surface thereof larger than the angle between the side wall of the second spacing portion and the lower surface thereof, a corner can be formed at the joint between the side wall of the first spacing portion and the side wall of the second spacing portion, such that the separated portions of the first functional layer corresponding to the respective light-emitting regions can be formed simultaneously. Consequently, the manufacturing process of the OLED array substrate is simpler and the cost thereof also is lower.

In some embodiments, the angle between the side wall of the first spacing portion and the lower surface of the first spacing portion is no less than 60°, and the angle between the side wall of the second spacing portion and the lower surface of the second spacing portion is no more than 30°.

In some embodiments, the lateral etching rate of the material of the first spacing portion is greater than that of the material of the second spacing portion. Under the same etching conditions, the greater the lateral etching rate of the material is, the larger the formed angle between the side wall and the lower surface will be.

In some embodiments, the width of an upper surface of the first spacing portion is no more than the width of the lower surface of the second spacing portion.

In such an OLED array substrate, by making the width of the upper surface of the first spacing portion no more than the width of the lower surface of the second spacing portion, a notch can be formed at the interface between the first spacing portion and the second spacing portion, such that the separated portions of at least the first functional layer corresponding to the respective light-emitting regions can be formed simultaneously. Consequently, the manufacturing process of the OLED array substrate is simpler and the cost thereof is also lower.

In some embodiments, the thickness of the first spacing portion is greater than the thickness of the first functional layer.

In such an OLED array substrate, by making the thickness of the first spacing portion greater than the thickness of the first functional layer, separated portions of the first functional layer corresponding to the respective light-emitting regions can be formed simultaneously between the first spacing portions. Consequently, the manufacturing process of the OLED array substrate is simpler and the cost thereof is also lower.

In some embodiments, the first functional layer comprises at least one of a hole injection layer, a hole transport layer and an electron barrier layer, and the second functional layer comprises at least one of a hole barrier layer, an electron transport layer and an electron injection layer. The first electrode layer is an anode layer, and the second electrode layer is a cathode layer.

In some embodiments, the light-emitting layer comprises an organic light-emitting layer and an optical compensation layer arranged between the organic light-emitting layer and the first functional layer. The optical compensation layer is configured to adjust the effective optical cavity length in the organic material functional layer so that light of different colors is emitted from the organic material functional layer at maximum light intensity.

In some embodiments, the first electrode layer is a reflective electrode layer, and the second electrode layer is a transparent electrode layer.

According to another aspect of the present disclosure, there is provided an OLED display panel comprising any of the OLED array substrates described above.

According to a further aspect of the present disclosure, there is provided a method of manufacturing an OLED array substrate. The method comprises successively forming a first electrode layer, a pixel definition layer, an organic material functional layer, and a second electrode layer. The organic material functional layer comprises light-emitting regions that emit light of different colors. The pixel definition layer comprises pixel regions corresponding to the light-emitting regions, and spacing regions arranged between adjacent pixel regions. Each spacing region is configured to electrically isolate adjacent light-emitting regions.

In some embodiments, forming the organic material functional layer comprises successively forming a first functional layer, a light-emitting layer, and a second functional layer. Each spacing region comprises a first spacing portion and a second spacing portion arranged successively in a light exit direction. The first spacing portion is configured to separate portions of at least the first functional layer corresponding to the respective light-emitting regions from each other.

It is to be noted that all the aspects of the present disclosure have similar or identical example implementations and benefits, which are not described here for simplicity.

These and other aspects of the present disclosure will be apparent from and will be elucidated with reference to the embodiments described hereinafter.

BRIEF DESCRIPTION OF DRAWINGS

FIG. 1 schematically illustrates a sectional view of an existing OLED array substrate.

FIG. 2 schematically illustrates a sectional view of an OLED array substrate according to embodiments of the present disclosure.

FIG. 3 schematically illustrates a sectional view of an OLED array substrate according to embodiments of the present disclosure.

DETAILED DESCRIPTION

Exemplary embodiments of the present disclosure will be described in detail below with reference to the accompanying drawings. The drawings are schematic and not drawn to scale, which are merely illustrative of the embodiments of the present disclosure and are not intended to limit the scope of the present disclosure. In the drawings, the same reference numerals denote the same or similar parts. In order to clarify the technical solution of the present disclosure, the process steps and device structures well known in the art are omitted here.

Hereinafter, specific examples of a touch panel, a display device, and a manufacturing method of a touch panel according to embodiments of the present disclosure will be described by way of example with reference to the accompanying drawings. The drawings are schematic and not drawn to scale, which are merely illustrative of the embodiments of the present disclosure and are not intended to limit the scope of the present disclosure.

For ease of description, spatially relative terms such as "under", "below", "lower", "above", "upper" and the like may be used herein to describe the relationship between one element or component and another element or component as shown in the drawings. It is to be understood that the spatially relative terms are intended to summarize different orientations of devices in use or operation other than those shown in the drawings. For example, if a device in the drawings is turned over, the elements described as being "under" or "below" other elements or components will be "above" other elements or components. In this way, the exemplary term "below" can cover two orientations of "under" and "above". The device may take other orientations (which is rotated 90 degrees or in other orientations), and the spatially relative descriptors used here are interpreted accordingly.

Hereinafter, the present disclosure will be described based on an example of RGB pixels including a red (R) light-emitting region, a blue (B) light-emitting region, and a green (G) light-emitting region. However, as will be appreciated by those skilled in the art, the present disclosure is not limited to the RGB pixel structure but may equally be applied to pixel structures including light-emitting regions of other number and types.

FIG. 1 schematically illustrates a sectional view of an existing OLED array substrate. As shown in FIG. 1, an OLED array substrate 100 comprises a substrate 101, a first electrode layer 102, a pixel definition layer 104, an organic material functional layer 103, and a second electrode layer 105 arranged successively in a light exit direction. The organic material functional layer 103 comprises a light-emitting region B that emits blue light, a light-emitting region G that emits green light, and a light-emitting region R that emits red light, and comprises a first functional layer, a light-emitting layer and a second functional layer arranged successively. The pixel definition layer 104 comprises pixel regions corresponding to the light-emitting regions B, G, R, and spacing regions arranged between adjacent pixel regions. In the OLED array substrate shown in FIG. 1, except that the light-emitting layer is vapor deposited using a fine metal mask to form portions of the light-emitting layer corresponding to the respective light-emitting regions B, G, R, the first functional layer, the second functional layer and the second electrode layer 105 are all formed by vapor deposition using a common mask. Therefore, the portions of the first functional layer, the second functional layer, and the second electrode layer corresponding to the respective light-emitting regions B, G, R are all connected together. As a result, as shown in FIG. 1, in the OLED array substrate, there exist both a longitudinal current perpendicular to the OLED array substrate and a lateral current parallel to the OLED array substrate. Upon displaying a monochromatic image, this lateral current causes two other light-emitting regions to be also illuminated weakly, resulting in abnormal display.

FIG. 2 illustrates a sectional view of an OLED array substrate according to an embodiment of the present disclosure. As shown in FIG. 2, an OLED array substrate 200 comprises a substrate 201, a first electrode layer 202, a pixel definition layer, an organic material functional layer 203, and a second electrode layer 205 arranged successively in a light exit direction. The organic material functional layer 203 comprises light-emitting regions B, G, R that emit light of different colors. The pixel definition layer comprises pixel regions corresponding to the light-emitting regions B, G, R, and spacing regions 204 arranged between adjacent pixel regions. Each spacing region 204 is configured to electrically isolate the adjacent light-emitting regions B, G, R.

It is to be noted that the pixel definition layer has a mesh structure. The meshes of the mesh structure correspond to the pixel regions of the pixel definition layer, while the edges of the meshes correspond to the spacing regions 204.

In the OLED array substrate proposed in the present disclosure, by employing the spacing regions that electrically isolate adjacent light-emitting regions, upon displaying a monochromatic (e.g. green) image by only illuminating a light-emitting region of a certain color (e.g. the light-emitting region G that emits green light), it is possible to prevent adjacent light-emitting regions of different colors (e.g. the light-emitting region B that emits blue light and the light-emitting region R that emits red light) from being also illuminated weakly, which results in abnormal display. As a result, the display effect of the display device can be improved.

As shown in FIG. 2, the organic material functional layer 203 comprises a first functional layer 2031, a light-emitting layer 2032, and a second functional layer 2033 arranged successively in the light exit direction, and each spacing region 204 comprises a first spacing portion 2041 and a second spacing portion 2042 arranged successively in the light exit direction. The first spacing portion 2041 is configured to separate portions of the first functional layer 2031 corresponding to the respective light-emitting regions from each other. Optionally, the first spacing portion 2041 further separates portions of the light-emitting layer 2032 corresponding to the respective light-emitting regions from each other.

In such an OLED array substrate, the adjacent light-emitting regions are electrically isolated from each other, as long as the portions of the first functional layer corresponding to the respective light-emitting regions are separated from each other. Therefore, as compared to an implementation of separating portions of the first functional layer, the light-emitting layer and the second functional layer corresponding to the respective light-emitting regions from each other, the second functional layer 2033 corresponding to the respective light-emitting regions can be integrally formed. Consequently, the manufacturing process of such an OLED array substrate is simpler and the cost thereof is also lower.

As schematically shown in FIG. 2, the angle α between a side wall of the first spacing portion 2041 and a lower surface of the first spacing portion 2041 is larger than the angle β between a side wall of the second spacing portion 2042 and a lower surface of the second spacing portion 2042.

In such an OLED array substrate, by making the angle α between the side wall of the first spacing portion 2041 and the lower surface thereof larger than the angle β between the side wall of the second spacing portion 2042 and the lower surface thereof, a corner can be formed at the joint between the side wall of the first spacing portion 2041 and the side wall of the second spacing portion 2042, such that the separated portions of the first functional layer 2031 corresponding to the respective light-emitting regions can be formed simultaneously. Consequently, the manufacturing process of the OLED array substrate is simpler and the cost thereof also is lower.

Optionally, the angle α between the side wall of the first spacing portion 2041 and the lower surface of the first spacing portion 2041 is no less than 60°, and the angle β between the side wall of the second spacing portion 2042 and the lower surface of the second spacing portion 2042 is no more than 30°.

Optionally, the lateral etching rate of the material of the first spacing portion 2041 is greater than the lateral etching rate of the material of the second spacing portion 2042. Under the same etching conditions, the greater the lateral etching rate of the material is, the larger the angle formed between the side wall and the lower surface will be.

FIG. 3 illustrates a sectional view of an OLED array substrate according to another embodiment of the present disclosure. An OLED array substrate 300 comprises a substrate 301, a first electrode layer 302, a pixel definition layer, an organic material functional layer 303, and a second electrode layer 305 arranged successively in a light exit direction. The organic material functional layer 303 comprises light-emitting regions B, G, R that emit light of different colors. The pixel definition layer comprises pixel regions corresponding to the light-emitting regions B, G, R, and spacing regions 304 arranged between adjacent pixel regions. Each spacing region 304 is configured to electrically isolate adjacent light-emitting regions B, G, R.

As shown in FIG. 3, the organic material functional layer 303 comprises a first functional layer 3031, a light-emitting layer 3032, and a second functional layer 3033 arranged successively in the light exit direction, and each spacing region 304 comprises a first spacing portion 3041 and a second spacing portion 3042 arranged successively in the light exit direction. The first spacing portion 3041 is configured to separate portions of the first functional layer 3031 corresponding to the respective light-emitting regions from each other. Optionally, the first spacing portion 3041 further separates portions of the light-emitting layer 3032 corresponding to the respective light-emitting regions from each other. Unlike the OLED array substrate 200 shown in FIG. 2, in the OLED array substrate 300, the width of an upper surface of the first spacing portion 3041 is no more than the width of the lower surface of the second spacing portion 3042.

In such an OLED array substrate, by making the width of the upper surface of the first spacing portion 3041 no more than the width of the lower surface of the second spacing portion 3042, a notch can be formed at the interface between the first spacing portion 3041 and the second spacing portion 3042, such that the separated portions of at least the first functional layer 3031 corresponding to the respective light-emitting regions can be formed simultaneously. Consequently, the manufacturing process of the OLED array substrate is simpler and the cost thereof is also lower.

In the OLED array substrate 300, since the notch formed at the interface between the first spacing portion 3041 and the second spacing portion 3042 ensures that the portions of the first functional layer 3031 are separated from each other, the angle α between the side wall of the first spacing portion 3041 and the lower surface of the first spacing portion 3041 may be larger than, smaller than, even equal to the angle β between the side wall of the second spacing portion 3042 and the lower surface of the second spacing portion 3042.

Optionally, as shown in FIGS. 2 and 3, the thicknesses of the first spacing portions 2041, 3041 are greater than the thicknesses of the first functional layers 2031, 3031.

In such an OLED array substrate, by making the thickness of the first spacing portion greater than the thickness of the first functional layer, the separated portions of the first functional layer corresponding to the respective light-emitting regions can be formed simultaneously between the first spacing portions. Consequently, the manufacturing process of the OLED array substrate is simpler and the cost thereof is also lower.

It is to be noted that, although the first spacing portion and the second spacing portion are schematically illustrated as a regular trapezoid in the drawings, in an alternative embodiment, the first spacing portion and the second spacing portion may take any suitable shape. For example, the first spacing portion and/or the second spacing portion may be in the shape of a rectangle, an inverted trapezoid, or the like.

In the aforesaid embodiments, the first functional layer may comprise at least one of a hole injection layer, a hole transport layer and an electron barrier layer, and the second functional layer may comprise at least one of a hole barrier layer, an electron transport layer and an electron injection layer. The first electrode layer is an anode layer, and the second electrode layer is a cathode layer.

In the aforesaid embodiments, the first electrode layer may be a reflective electrode layer, and the second electrode layer may be a transparent electrode layer.

In the aforesaid embodiments, the light-emitting layer may comprise an organic light-emitting layer and an optical compensation layer arranged between the organic light-emitting layer and the first functional layer. The optical compensation layer is configured to adjust the effective optical cavity length in the organic material functional layer so that light of different colors is emitted from the organic material functional layer at maximum light intensity.

The present disclosure further provides an OLED display panel comprising any of the OLED array substrates described above.

In addition, the present disclosure provides a method of manufacturing an OLED array substrate. The method comprises successively forming a first electrode layer, a pixel definition layer, an organic material functional layer, and a second electrode layer. The organic material functional layer comprises light-emitting regions that emit light of different colors. The pixel definition layer comprises pixel regions corresponding to the light-emitting regions and spacing regions arranged between adjacent pixel regions. Each spacing region is configured to electrically isolate adjacent light-emitting regions.

In the above manufacturing method, forming the organic material functional layer may comprise successively forming a first functional layer, a light-emitting layer, and a second functional layer. Each spacing region comprises a first spacing portion and a second spacing portion arranged successively in a light exit direction. The first spacing portion is configured to separate portions of at least the first functional layer corresponding to the respective light-emitting regions from each other.

In such a manufacturing method, the first spacing portion and the second spacing portion may be formed in the same layer. Alternatively, the first spacing portion and the second spacing portion may be formed in different layers.

The concept of the present disclosure can be widely applied to any system having display function, including a desktop computer, a laptop computer, a mobile phone, a tablet computer, and the like. In addition, although several embodiments have been described in detail above, other modifications are possible. For example, components may be added to the described system or removed from the described system. Other embodiments may be within the scope of the present disclosure. Numerous variations and modifications may be made by those skilled in the art without departing from the spirit and scope of the present disclosure in view of the teachings of the present disclosure.

The invention claimed is:

1. An OLED array substrate comprising a first electrode layer, a pixel definition layer, an organic material functional layer, and a second electrode layer arranged successively in a light exit direction,
    wherein
    the organic material functional layer comprises light-emitting regions being configured to emit light of different colors,
    the pixel definition layer comprises pixel regions corresponding to the light-emitting regions and spacing regions arranged between adjacent pixel regions,
    wherein the organic material functional layer comprises a first functional layer, a light-emitting layer, and a second functional layer arranged successively in the light exit direction, and each spacing region comprises a first spacing portion and a second spacing portion arranged successively in the light exit light, the first spacing portion being configured to separate portions of at least the first functional layer corresponding to respective light-emitting regions from each other.

2. The array substrate according to claim 1, wherein an angle between a side wall of the first spacing portion and a lower surface of the first spacing portion is larger than an angle between a side wall of the second spacing portion and a lower surface of the second spacing portion.

3. The array substrate according to claim 2, wherein the angle between the side wall of the first spacing portion and the lower surface of the first spacing portion is no less than 60°, and the angle between the side wall of the second spacing portion and the lower surface of the second spacing portion is no more than 30°.

4. The array substrate according to claim 2, wherein a lateral etching rate of a material of the first spacing portion is greater than a lateral etching rate of a material of the second spacing portion.

5. The array substrate according to claim 1, wherein a width of an upper surface of the first spacing portion is no more than a width of the lower surface of the second spacing portion.

6. The array substrate according to claim 1, wherein a thickness of the first spacing portion is greater than a thickness of the first functional layer.

7. The array substrate according to claim 1, wherein the first functional layer comprises at least one of a hole injection layer, a hole transport layer and an electron barrier layer, the second functional layer comprises at least one of a hole barrier layer, an electron transport layer and an electron injection layer, the first electrode layer is an anode layer, and the second electrode layer is a cathode layer.

8. The array substrate according to claim 1, wherein the light-emitting layer comprises an organic light-emitting layer and an optical compensation layer arranged between the organic light-emitting layer and the first functional layer.

9. The array substrate according to claim 1, wherein the first electrode layer is a reflective electrode layer, and the second electrode layer is a transparent electrode layer.

10. A manufacturing method of an OLED array substrate, comprising:
forming a first electrode layer, a pixel definition layer, an organic material functional layer and a second electrode layer successively,
wherein
the organic material functional layer comprises light-emitting regions that emit light of different colors,
the pixel definition layer comprises pixel regions corresponding to the light-emitting regions and spacing regions arranged between adjacent pixel regions,
wherein forming the organic material functional layer comprises forming a first functional layer, a light-emitting layer and a second functional layer successively, and each spacing region comprises a first spacing portion and a second spacing portion arranged successively in a light exit direction, the first spacing portion being configured to separate portions of at least the first functional layer corresponding to respective light-emitting regions from each other.

11. The manufacturing method according to claim 10, wherein the first spacing portion and the second spacing portion are formed in a same layer.

12. The manufacturing method according to claim 10, wherein the first spacing portion and the second spacing portion are formed in different layers.

13. An OLED display panel comprising an OLED array substrate, the OLED array substrate comprising a first electrode layer, a pixel definition layer, an organic material functional layer, and a second electrode layer arranged successively in a light exit direction,
wherein
the organic material functional layer comprises light-emitting regions being configured to emit light of different colors,
the pixel definition layer comprises pixel regions corresponding to the light-emitting regions and spacing regions arranged between adjacent pixel regions,
wherein the organic material functional layer comprises a first functional layer, a light-emitting layer, and a second functional layer arranged successively in the light exit direction, and each spacing region comprises a first spacing portion and a second spacing portion arranged successively in the light exit light, the first spacing portion being configured to separate portions of at least the first functional layer corresponding to respective light-emitting regions from each other.

14. The OLED display panel according to claim 13, wherein an angle between a side wall of the first spacing portion and a lower surface of the first spacing portion is larger than an angle between a side wall of the second spacing portion and a lower surface of the second spacing portion.

15. The OLED display panel according to claim 14, wherein the angle between the side wall of the first spacing portion and the lower surface of the first spacing portion is no less than 60°, and the angle between the side wall of the second spacing portion and the lower surface of the second spacing portion is no less than 30°.

16. The OLED display panel according to claim 14, wherein a lateral etching rate of a material of the first spacing portion is greater than a lateral etching rate of a material of the second spacing portion.

17. The OLED display panel according to claim 13, wherein a width of an upper surface of the first spacing portion is no more than a width of the lower surface of the second spacing portion.

* * * * *